United States Patent [19]

Chou

[11] Patent Number: 5,578,516
[45] Date of Patent: Nov. 26, 1996

[54] HIGH CAPACITANCE DYNAMIC RANDOM ACCESS MEMORY MANUFACTURING PROCESS

[75] Inventor: Hsiang-Ming Chou, Hsin Chu, Taiwan

[73] Assignee: Vanguard International Semiconductor Corporation, Hsin-Chu, Taiwan

[21] Appl. No.: 499,745

[22] Filed: Jul. 7, 1995

[51] Int. Cl.⁶ .............. H01L 21/70; H01L 27/00
[52] U.S. Cl. .............. 437/52; 437/60; 437/919
[58] Field of Search .............. 437/47, 52, 60, 437/919; 148/DIG. 14

[56] References Cited

U.S. PATENT DOCUMENTS

| | | | |
|---|---|---|---|
| 4,742,018 | 5/1988 | Kimura et al. | 437/48 |
| 5,071,781 | 12/1991 | Seo et al. | 437/47 |
| 5,137,842 | 8/1992 | Chán et al. | 437/48 |
| 5,219,780 | 6/1993 | Jun | 437/52 |
| 5,234,858 | 8/1993 | Fazan et al. | 437/52 |
| 5,266,512 | 11/1993 | Kirsch | 437/52 |
| 5,273,925 | 12/1993 | Yamanaka | 437/52 |
| 5,286,668 | 2/1994 | Chou | 437/52 |

*Primary Examiner*—H. Jey Tsai
*Attorney, Agent, or Firm*—George O. Saile

[57] ABSTRACT

A method for manufacturing an array of dynamic random access memory (DRAM) cells having high capacitance stacked capacitors, is accomplished. The method involves forming node contact openings to the capacitor source/drain contact areas of the field effect transistors, and forming the capacitor bottom electrodes using patterned layers of heavily doped and undoped polysilicon. The selective etch property of the heavily doped polysilicon to the undoped polysilicon is used to form bottom electrodes having sidewall spacers extending upward and increasing the effective capacitor area. After doping the bottom electrode by either ion implantation or out-diffusion, the stacked capacitors on the array of DRAM cells is completed by forming an inter-electrode dielectric layer on the bottom electrode surfaces and forming a top electrodes from a patterned doped polysilicon layer.

23 Claims, 8 Drawing Sheets

5,578,516

HIGH CAPACITANCE DYNAMIC RANDOM ACCESS MEMORY MANUFACTURING PROCESS

BACKGROUND OF THE INVENTION (1) Field of the Invention

The present invention relates to semiconductor integrated circuit devices, and more particularly to the fabrication of dynamic random access memory (DRAM) device having capacitors with increased capacitance.

(2) Description of the Prior Art

Advances in semiconductor processing technologies has dramatically decreased the size of discrete devices on semiconductor substrates and have increased the integrated circuit density on the substrate. The dynamic random access memory (DRAM) device is one type of semiconductor devices experiencing this down scaling is size and increase in density. This DRAM device is used extensively in the electronic industry and particularly in the computer industry for data storage. The DRAM device is composed of an array of memory cells which are addressable by peripheral circuits on the chip for reading and writing information on the individual cells. These individual memory cells are formed from a single pass transistor and storage capacitor, and the information is represented on the cell as binary data by the presents of charge on the storage capacitor. The number of memory cells on a DRAM chip are expected to reach 256 Megabits by the year 1998 and about 1 Gigabits by the year 2001. If these goals are to be achieved on a DRAM chip of reasonable size, then the memory cells on the chip must be substantially reduced in size. For the latest technology Roadmap on the future trends in DRAMs by the Semiconductor Industry Association (SIA) see, the article entitled "Extending Optical Lithography to the Gigabit Era" by M. Levenson, in Solid State Technology, page 57, Feb. 1995, with specific reference to table I.

Unfortunately, as the individual memory cells decrease in size, the storage capacitor must also decrease in size. However, the reduction in the storage capacitor size makes it difficult to store sufficient charge on the capacitor to maintain the required signal-to-noise level, and to maintain a reasonable refresh cycle time to retain the necessary charge level. Therefore, alternative methods are required to maintain the capacitance while restricting the capacitor area to the size of the smaller cell area.

Two basic approaches for increasing capacitance without increasing the physical area of the capacitor is to use a trench capacitor formed within a trench in the cell area, and a stacked capacitor formed on the cell area over the transistor. However, as the cell area decreases in size it becomes increasingly more difficult to form the deeper trench required for trench capacitance and to also provide the area for the transistor. The stacked capacitor, however, has received considerable interest in recent years because of the variety of ways that its shape can be changed in the third dimension (vertical direction) to increase the capacitance without increasing the area it occupies on the substrate.

Numerous three dimensional capacitor structures have been reported in the literature. For example, K. Seo, U.S. Pat. No. 5,071,781, and H. M. Chou, U.S. Pat. No. 5,286,668 teach methods for making a stacked capacitor having fin-shaped electrodes that extend upward and outward over the cell area. Another approach is to build vertical extending sidewalls and columns, as described by P. Fazan, U.S. Pat. No. 5,234,858, and by Y. Jun, U.S. Pat. No. 5,219,780. Still another method for making a capacitor having a H-shaped electrode structure is described by H. Chan, U.S. Pat. No. 5,137,842.

In general, the methods involve more processing step and are more costly to manufacture and have lower process and final test yields. Therefore, there is still a need to further improve the capacitor structures and provide a simple manufacturing process.

SUMMARY OF THE INVENTION

It is a principle object of the present invention to provide a method for forming on a DRAM device a stacked storage capacitor with an increased effective capacitance area by forming vertical sidewall.

It is another object to fabricate these improved capacitors with high capacitance by a method of selectively etching a heavily doped polysilicon layer relative to an undoped polysilicon layer.

It is still another object of this invention to provide a capacitor that is simple to manufacture and cost effective.

The method of this invention for forming these array of memory cells on a DRAM device, having high capacitance storage capacitors, starts by providing a semiconductor substrate with an array of device areas formed by field oxide areas that surround and electrically isolate the device areas. A gate oxide is then formed on the device areas by thermal oxidation, and a doped first polysilicon layer, having a cap oxide ($SiO_2$) on its surface, is patterned to form the gate electrodes for the FETs. Concurrently, from the same first polysilicon layer, word lines are formed elsewhere on the substrate to provide electrical connection to peripheral circuits on the DRAM chip. Two lightly doped source/drain areas are formed adjacent to and on each side of each FET gate electrode, and are typically formed by ion implantation. Insulating sidewall spacers are formed on the gate electrode by depositing an insulating layer, such as silicon oxide and anisotropically etch back the insulator to the substrate surface. Source/drain contact areas are formed adjacent to the sidewalls typically by implantation to complete the field effect transistors (FET). Alternatively, the ohmic contacts can be made at a later process step by out diffusing a dopant from a doped polysilicon layers. After completing the array of FETs one in each memory cells, the array of stacked capacitors are formed next, in which each storage capacitor contacts one of the two source/drain areas of each FET.

The method for making the capacitors begins by depositing a first insulating layer on the device areas and elsewhere on the substrate, and etching contact openings (self-aligned) to one of the two source/drain contacts of each FET. An undoped second polysilicon layer is deposited on the first insulating layer and in the contact openings, thereby making contact to the source/drain areas of each FET. A third polysilicon layer is deposited in situ doped, such as with an N-type dopant, and at a sufficiently low temperature so as to prevent the out diffusion of the dopant from the third polysilicon layer into the underlying second polysilicon layer. A second insulating layer, such as silicon nitride ($Si_3N_4$), is deposited on the in situ doped third polysilicon layer. The multilayer comprising of the second insulating layer, and the third and second polysilicon layers are then patterned using a photoresist mask and anisotropic plasma etching, leaving portions aligned to and over the contact openings and extending over the planned capacitor areas within each memory cell area. An undoped fourth polysilicon layer is deposited at a temperature below 600° C. and anisotropically etch back to form polysilicon sidewall spacers on the sidewalls of the patterned portions of the second and third polysilicon layers. The exposed second insulating layer ($Si_3N_4$) and the doped patterned third polysilicon within the polysilicon sidewall spacers are selectively etched to the undoped second polysilicon layer. For example, a hot phosphoric acid solution can be used which does not significantly etch the undoped polysilicon. The remaining polysilicon structures form the bottom electrodes of the storage capacitors. The array of bottom electrodes are made conducting by doping, such as by ion implantation of an N-type dopant. The array of storage capacitors are then completed by depositing an inter-electrode dielectric layer on the surface of the bottom electrodes and depositing and patterning a doped fifth polysilicon layer to form the top capacitor electrodes, and thereby forming an array of memory cells by this invention. The sidewall extension formed on the bottom electrodes significantly increasing the capacitance of each storage capacitor.

A second embodiment is provided which is similar to the first embodiment, but includes an additional N-doped polysilicon layer deposited prior to depositing the undoped second polysilicon layer. The method for making the capacitors by the second embodiment begins, as in the first embodiment, by depositing a first insulating layer over the completed FETs in the device areas, and elsewhere on the substrate, and etching contact openings (self-aligned) to one of the two source/drain contacts of each FET. However, prior to depositing the undoped first polysilicon layer, as in the first embodiment, a doped polysilicon layer, here after referred to as a node polysilicon layer, is deposited over the first insulating layer and in the node contact opening making contact to the source/drain of the FET. The conductivity type of the node polysilicon layer and the source/drain areas are of like type (e.g. N-type). The method now proceeds similar to the first embodiment up to the ion implantation step. A second undoped polysilicon layer, a heavily doped third polysilicon layer and a second insulating layer ($Si_3N_4$) are deposited and patterned to define the bottom electrode area for the capacitor. All layers are deposited at low temperature, so as to avoid the unintentional doping of the second poly-silicon layer. A conformal undoped fourth polysilicon layer, also deposited at low temperature, is then anisotropically etching back to the patterned second insulating layer on the electrode areas, and thereby forming spacers on the side-walls of the node, second and third polysilicon layers. The second insulating and the heavily doped third polysilicon layers are removed by selective etching, such as in a hot phosphoric acid solution, while leaving essentially unetched the undoped polysilicon which includes the the polysilicon sidewall spacers and the doped node polysilicon which is itself protected by the undoped polysilicon layers. The stacked capacitor bottom electrodes having sidewall portion extending upward and effectively increasing the electrode area are formed in this way. However, the ion implantation step of the first embodiment used to dope the second polysilicon layer in the bottom electrodes is now eliminated and out diffusion of the N-type dopant from the node polysilicon layer is used to dope the undoped second polysilicon layer and the fourth polysilicon layer (sidewall spacers) in the second embodiment. The array of storage capacitors are now completed, as in the first embodiment, by depositing a interelectrode dielectric layer on the surface of the bottom electrodes and depositing and patterning a fifth polysilicon layer to form the top electrodes, thereby completing the array of memory cells of this invention. The in situ doped and undoped polysilicon layers, incuding the node polysilicon layer, can be deposited in the same low temperature CVD reactor, and thereby substantially reducing the processing time. Including the node polysilicon layer in the sequence of process steps eliminates the need for an additional implant step, and further reduces manufacturing cost.

BRIEF DESCRIPTION OF THE DRAWINGS

The accompanying drawing that are included with the preferred embodiments for describing the invention include.

DESCRIPTION OF THE PREFERRED EMBODIMENTS

Now in keeping with the objects of this invention, the first embodiment for manufacturing this novel high capacitance stacked capacitor is covered in detail. This capacitor can be fabricated on FET structures that are currently used in the manufacture of DRAMs, and therefore, the fabrication of the FET is briefly described to better understand the current invention. For the sake of simplicity only one DRAM cell of the array of cells is depicted in the Figs.

Figure 1:
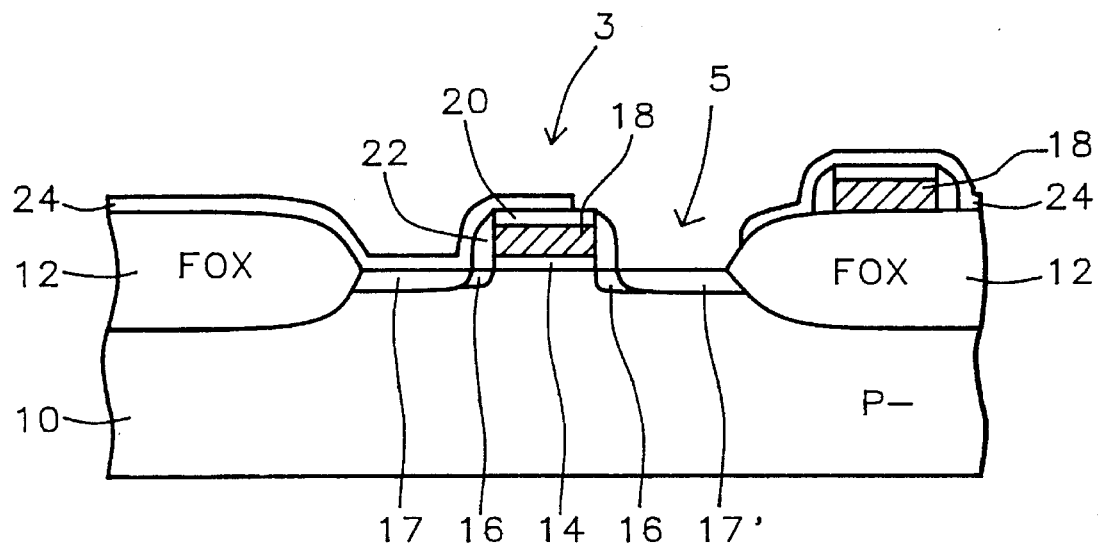
FIGS. 1 through 8 illustrate in schematic cross-section representation a DRAM cell having a stacked storage capacitor make by the method of this invention contacting a conventionally made FET. The FIGS. 1–8 follow the process flow for a first embodiment.

Referring now to FIG. 1, a cross-sectional view of a partially completed DRAM cell is shown having a field effect transistor (FET) 5 built on the surface of a semiconductor substrate 10. The preferred substrate is composed of a P-type single crystal silicon with a <100> crystallographic orientation. A thick Field OXide 12 (FOX), for isolating the device, is first formed surrounding the device region where the device is to be built. Briefly, the method for forming the FOX commonly practiced in the industry is to use a thin thermal oxide (pad oxide) and a silicon nitride layer as an oxidation resistant mask (not shown). The desired field oxide regions are etched open in the oxide/nitride layer using conventional photolithographic techniques and the field oxide 12 is thermally grown, typically to a thickness of about 4000 to 6000 Angstroms.

The semiconductor devices are then fabricated on and in the substrate 10 silicon surface in the non-oxidize areas, after removing the silicon nitride layer using a wet etch. For example, one can use a solution of heated phosphoric acid ($H_3PO_4$). For a typical DRAM cell, the most commonly used transistor is an N-channel field effect transistor (FET) having doped polysilicon gate electrodes. The FET for DRAM cells is now briefly described with reference to FIG. 1.

The silicon surface is first carefully cleaned and a good quality thermal oxide is grown to form the gate oxide 14 in the device area. The preferred thickness of the gate oxide is between about 80 to 140 Angstroms. A first polysilicon layer 18 is blanket deposited, for example, by low pressure chemical vapor deposition (LPCVD). A cap oxide, such as a CVD silicon oxide 20 is deposited on the first polysilicon layer 18 and both layers are patterned by conventional photolithographic techniques and an anisotropic plasma etch (dry etch) to form the gate electrode structure comprising of layer 18 and 20, as shown in FIG. 1. The patterned layer 18 also form concurrently word lines that are used to interconnect the gate electrodes to other circuits on the DRAM chip. Typically, the thickness of layer 18 is between about 2000 to 3000 Angstroms and is doped with N-type dopant, such as arsenic (As) or phosphorus (P) for the N-channel FETs. The cap oxide 20 is usually formed by CVD, for example, by the decomposition of tetraethoxysilane (TEOS), and the thickness is usually between about 1000 to 2000 Angstroms.

In todays narrow channel FET devices it is common practice to form lightly doped regions 16 for the source/drain to minimize undesirable short channel that can occur. This doping is usually accomplished for N-channel FETs by implanting a N-type species, such as arsenic or phosphorous, in the device area adjacent to the gate electrode 18. For example, a typical implantation might consist of a phosphorous $P^{31}$ at a dose of between 1 to 10 E 13 atoms/cm$^2$ and with an energy of 30 to 80 Kev. As is common in the industry photoresist masking can be used to avoid implanting in areas not requiring the implant.

After forming the lightly doped source/drain areas 16, sidewall insulating spacers 22 are formed on the sidewalls of the gate electrode structure 18. These spacers are formed by depositing a blanket layer of low temperature silicon oxide on the substrate and using an anisotropic etch to etch back to the surface of the source/drain area, as shown in FIG. 1. For example, the silicon oxide can be a chemical vapor deposition using tetraethoxysilane (TEOS) at a temperature in the range of about 650° to 900° C., and the etch back can be accomplished with a reactive plasma etcher of various design and using an appropriate gases mixture. For example, the etching can be performed in a gas mixture of carbon tetrafluoride and hydrogen ($CF_4/H_2$).

The FET device is then completed by forming the source/drain contact areas 17 and 17' by a high dose N-type implant in the source/drain areas adjacent to the spacers 22. For example, arsenic ($As^{75}$) can be used having a dose of between about 2 E 15 to 1 E 16 and an implant energy of between about 20 to 70 KeV. Alternatively, the $N^+$ doped contacts can be formed at a later processing step by out diffusing from an $N^+$ dopant source, such as from an $N^+$ polysilicon layer used as part of the capacitor bottom electrode and $N^+$ polysilicon bit line metallurgy.

The remainder of this embodiment relates more particularly to the objects of this invention which describes in detail the novel method of building a high capacitance stacked storage. More specifically, the method uses a process of selectively etching a heavily doped polysilicon layer while leaving essentially unetched an undoped polysilicon layer to form the storage capacitor bottom electrode. The differences in etch rate between doped and undoped polysilicon is used to form vertical portions on the bottom electrode to effective increase the surface area of the capacitor.

Referring still to FIG. 1, a first insulating layer 24 is deposited on the substrate over the device area and elsewhere on the substrate to electrically insulate the FET devices from the next conductive layer. The first insulating layer 24 is preferably composed of a silicon oxide, and is deposited in a low pressure chemical vapor deposition (LPCVD) process reactor using, for example, tetraethoxysilane (TEOS), at a preferred temperature range of between about 700° to 800° C. The preferred thickness of layer 24 is between about 500 to 1500 Angstroms.

Photolithographic methods and plasma etching are used to form openings in the first insulating layer over the source/drain contact areas designed in the chip mask set to be the capacitor node contacts. The contact openings are formed preferably extending over the polysilicon gate electrode 18 and the field oxide 12 and etched to the surface of the cap oxide layer 20 to effectively form self-aligned contact openings.

Figure 2:
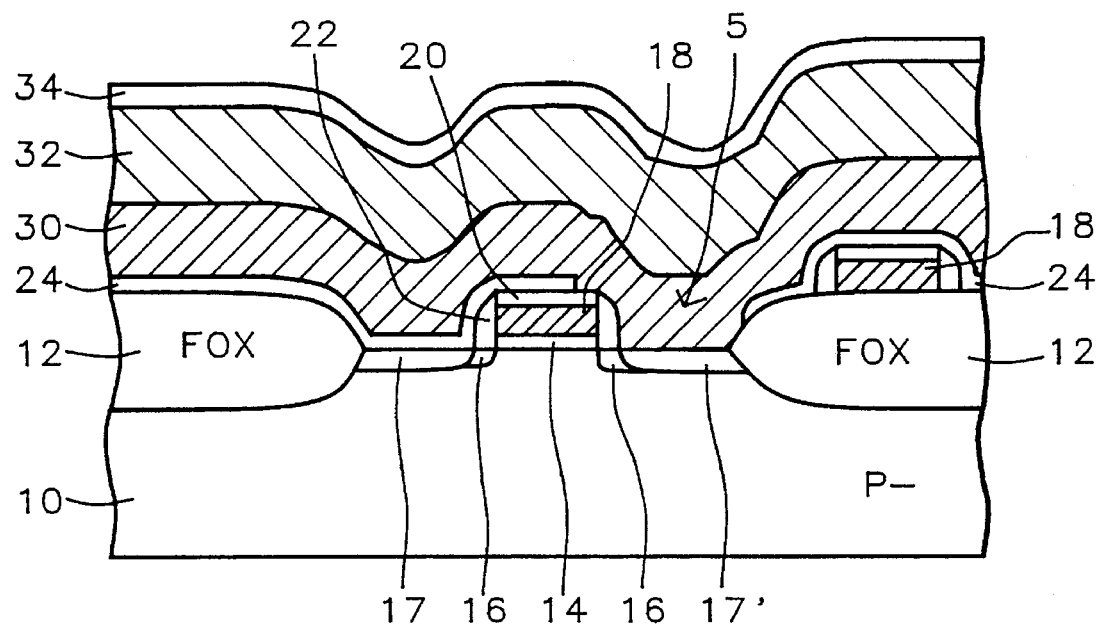
Figure 7:
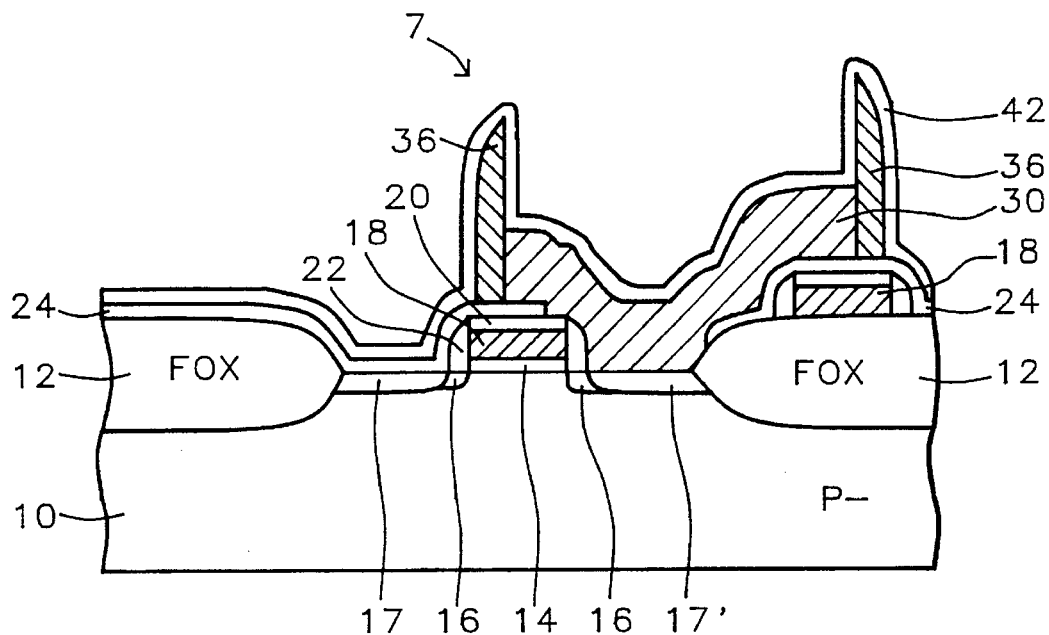

Referring now to FIGS. 2, through 7, the sequence of steps are shown for forming the bottom electrode. As shown in FIG. 2, a undoped second polysilicon layer 30 is deposited on the first insulating layer 24 and extending in the capacitor node contact opening 5. The polysilicon layer 30 is preferably deposited using a low pressure CVD, using for example, a reactant gas mixture containing silane ($SiH_4$). The preferred thickness of layer 30 is between about 1000 to 3000 Angstroms. An in situ heavily doped third polysilicon layer 32 is then deposited at low temperature over the undoped polysilicon layer 30. The preferred method is a low pressure chemical vapor deposition at a temperature of less than about 600° C. The preferred dopant is phosphorus (P) and the preferred dopant concentration in the polysilicon layer 32 is between about 1.0 E 19 to 1.0 E 21 atoms/cm$^3$. The in situ doped LPCVD deposition can be carried out by adding a doping gas such as phosphine (PH3) to the CVD reactant gases. The heavily doped third polysilicon layer 32 is deposited at low temperatures to avoid the unintentional out diffusion of the dopant into the undoped polysilicon layer 30, which is later used as an etch stop layer when the doped layer 32 is selectively etched to form the capacitor bottom electrode.

After depositing the third polysilicon layer 32 a second insulating layer 34 is deposited, as is also shown in FIG. 2. Layer 34 is preferably a silicon nitride ($Si_3N_4$) layer, but alternatively, a silicon oxide layer can also be used. However, in order to avoid high temperatures which will result in the unintentional doping of the undoped second polysilicon layer 30 by out diffusion from the doped layer 32, a LPCVD is avoided and a low temperature plasma enhanced CVD (PECVD) method is used. The PECVD deposition is achieved using reactant gas mixture containing silane ($SiH_4$) and ammonia ($NH_3$) or alternatively, can be carried out in a gas mixture containing silane ($SiH_4$) and nitrogen ($N_2$). The deposition is usually performed at a deposition temperature typically in the range of between about 200° to 350° C. The preferred thickness of the silicon nitride layer 34 is between about 200 to 500 Angstroms.

Figure 3:
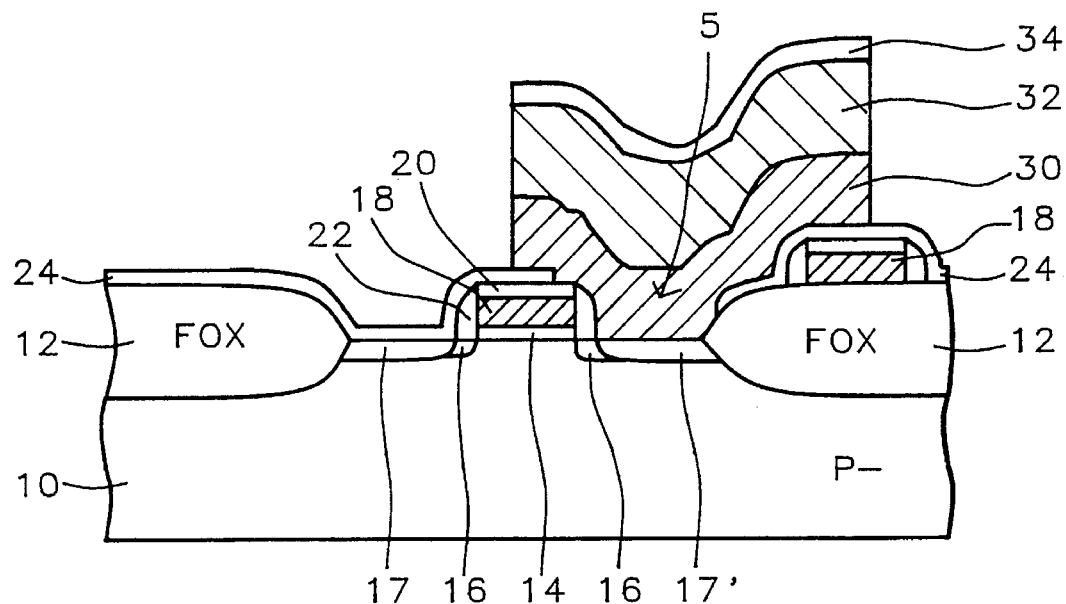

Referring now to FIG. 3, photolithographic means and anisotropic plasma etching are used to pattern the multilayer composed of the layers 30, 32 and 34. The resulting structure is shown in FIG. 3 after the layers are etched and the photoresist mask is removed. The patterned layers are aligned over the node contact opening 5 and extend outward over but, are confined within the designed cell area.

The anisotropic etching is performed, for example, in a reactive ion etcher (RIE) or a high-plasma-density low-pressure etcher. The silicon nitride can be etched in a gas mixture, for example, containing carbon tetrafluoride ($CF_4$) and oxygen ($O_2$) in a carrier gas such as Argon (Ar), while the polysilicon layers are preferably etched in a gas mixture containing chlorine ions. For example, the gas mixture can contain molecular chlorine ($Cl_2$) and a carrier gas such as argon (Ar). Also gas mixtures containing gases such as dichlorodifluoromethane ($CCl_2F_2$) can also be used.

Figure 4:
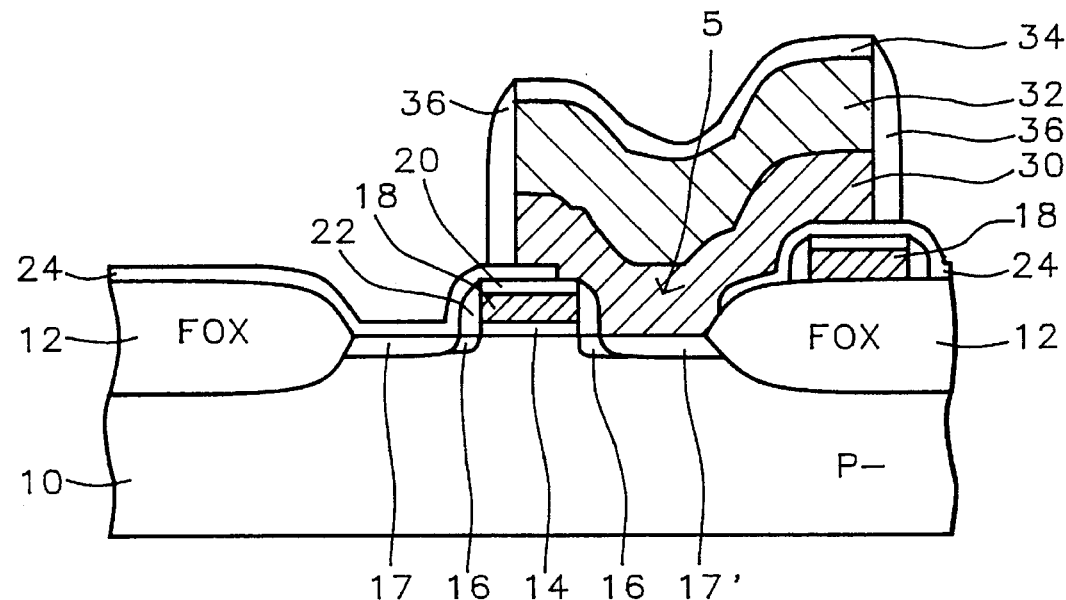

A conformal undoped fourth polysilicon layer 36 is now deposited over the patterned multilayer and elsewhere on the exposed first insulating layer 24, and blanket etched back to the silicon nitride layer 34, and thereby forming undoped polysilicon sidewall spacers 36., as shown in FIG. 4. The layer 36 is deposited also using a low pressure chemical vapor deposition similar to the deposition of polysilicon layer 30, for example, a reactant gas mixture containing silane ($SiH_4$) can be. However, to avoid the unintentional out diffusion doping of the undoped polysilicon layer 30 by the heavily doped polysilicon layer 32, the LPCVD deposition temperature is restricted to a value of less than about 600° C. The preferred thickness of layer 36 is between about 500 to 1500 Angstroms, and after the etch back the sidewall spacer 36 have a width of between about 500 to 1000 Angstroms.

Figure 5:
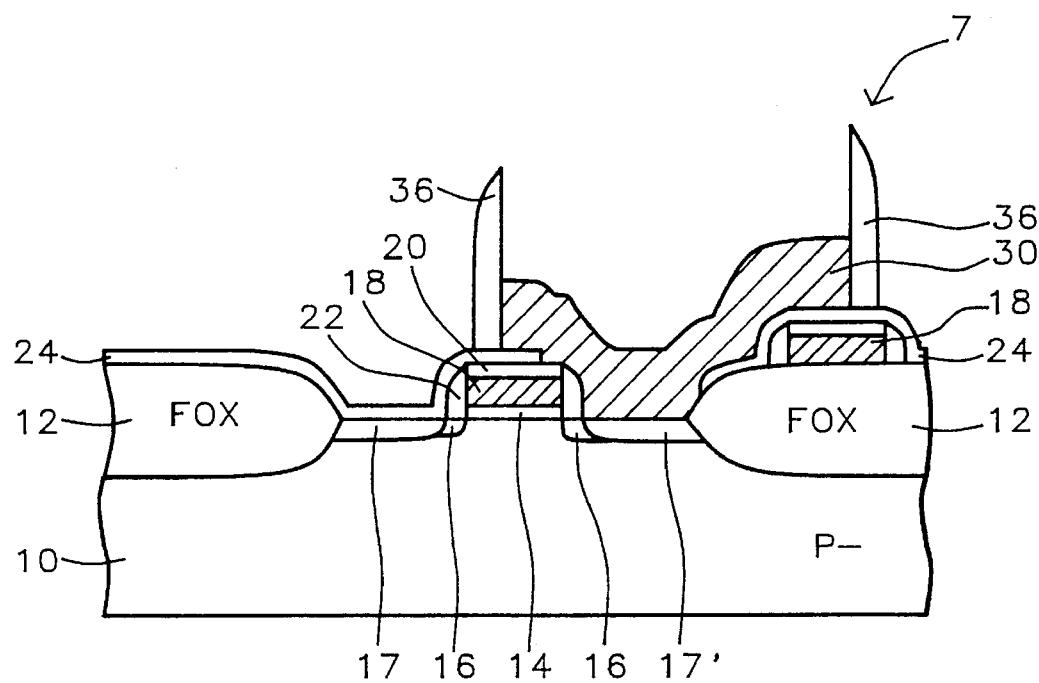

Now, an important feature of the invention is the removal of the silicon nitride layer 36 and the selective removal of the heavily doped polysilicon layer 34 by a hot phosphoric acid etch. As shown in FIG. 5, the phosphoric acid etch is used to etch both the nitride and the heavily doped polysilicon layer while leaving essentially unetched the undoped portions of the polysilicon layer 30 and 36. This result in a capacitor bottom electrode 7 composed of a horizontal portion formed from the polysilicon layer 30 and a vertical portion formed from the polysilicon sidewall spacer 36. The vertical portions of the electrode formed from the sidewall spacers 36 substantially increase the effective surface area of the bottom electrode 7. The etching is performed in a phosphoric acid solution having a concentration of phosphoric acid ($H_3PO_4$) in water of between about 10 to 90%, and the etch bath is maintained at a temperature of between about 140° to 180° C. Typically, at these etch conditions the etch rate ratio of doped polysilicon to undoped polysilicon is between about 100/1 to 400/1.

Figure 6:
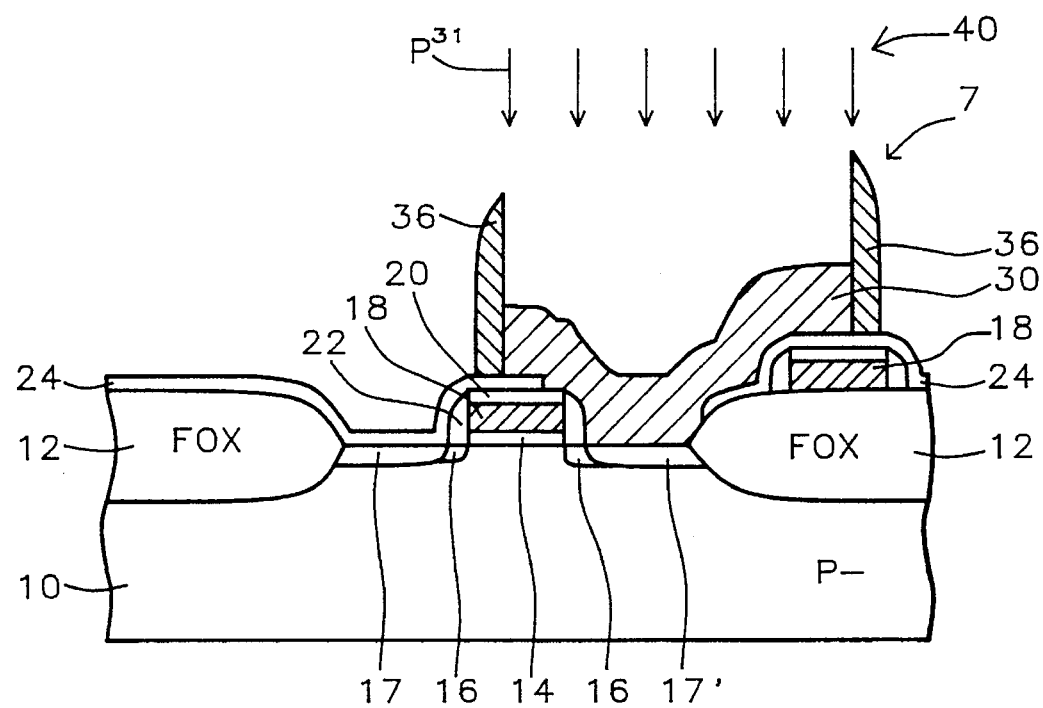

Referring now to FIG. 6, the bottom electrode composed of layer 30 and 36 is made electrically conducting by doping the electrode with an $N^+$ dopant by implantation, as indicated in FIG. 6 by the vertically downward pointing arrows 40. The preferred implant dopant is phosphorus ($P^{31}$) and the preferred concentration of the dopant in the bottom electrode, after annealing to form a uniform concentration in the layers 30 and 36, is between about $1.0 \text{ E } 19$ to $1.0 \text{ E } 21$ atoms/$cm^3$. This essentially completes the fabrication of the capacitor bottom electrode 7.

Referring now to FIG. 7, a thin dielectric layer is formed on the surface of the bottom electrode 7 to form the interelectrode dielectric layer 42. The dielectric layer 42 should have as high a dielectric constant as possible while being as thin as possible to achieve the highest capacitance. The preferred thickness of the dielectric layer 42 is in the range of 50 to 100 Angstroms. Composite films of silicon oxide/silicon nitride/silicon oxides (ONO) are currently preferred over a single layer of silicon oxide because of its improved properties, such as higher dielectric constant and less pin holes. For example, the bottom electrode 7 can be thermally oxidized to form a silicon oxide ($SiO_2$) and then a silicon nitride layer can be deposited by PECVD and then thermally oxidized to reduce the surface and form a thin silicon oxide ($SiO_2$) to form the ONO layer.

Figure 8:
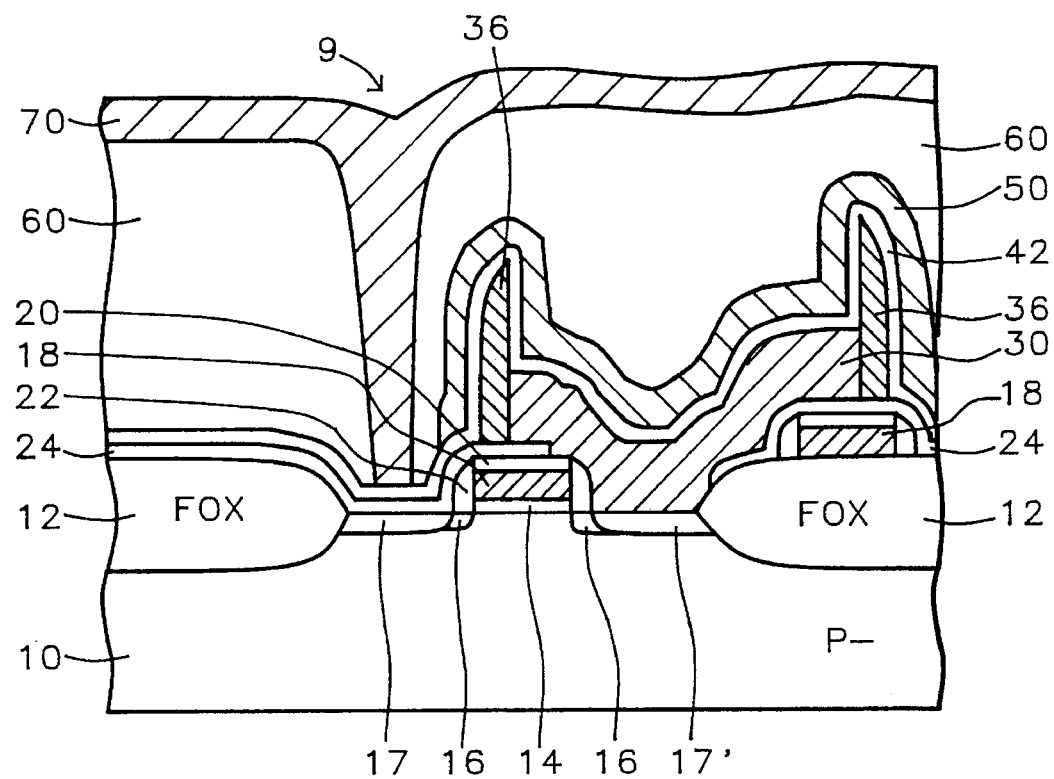

A DRAM memory cell is shown completed up to the first interconnecting metallurgy, as shown in FIG. 8. A fifth polysilicon layer 50 is deposited over the thin dielectric layer 42 and patterned by conventional photolithographic means and plasma etching to form the top electrode 50, and thereby complete the capacitor structure. The top polysilicon layer 50 is also doped with a N type impurity to increase its electrical conductivity. The dopant species, is preferably phosphorus (P), and the concentration in the polysilicon layer 50 is in a range of between about $1.0 \text{ E } 19$ to $1.0 \text{ E } 21$ atoms/$cm^3$, and the preferred thickness of layer 50 is between about 500 to 1000 Angstroms.

Also shown in FIG. 8, to complete the array of DRAM cells, a fourth insulating layer 60, typically a borophosphosilicate glass (BPSG) having a low flow temperature is deposited by LPCVD and annealed to form a more planar surface for the first metal wiring that is formed next. The typical thickness of layer 60 is between about 2000 to 4000 Angstroms. A photoresist contact mask is used to open the bit line contact openings 9 in the BPSG insulating layer 60, the thin dielectric layer 42 and the first insulating layer 22 to the second of the two source/drain areas 17.

A bit line conducting layer 70 is deposited on the insulating layer and in the bit line contact opening 9. The conducting layer can be a polycide composed of for example $N^+$ doped polysilicon with a tungsten silicide ($WSi_2$) formed on the surface or alternatively a metal such as aluminium (Al) or aluminium copper alloy can be used with a tungsten (W) plug in the contact opening 9.

Referring now more particularly to FIGS. 9 through 15, a second embodiment is disclosed for making the array of high capacitance DRAM capacitors. The method is similar to the first embodiment up to the completion of the FETs as shown in FIG. 1, and is therefore not described further. Also most of the deposited layers and process steps are the same as in the first embodiment and only the differences will be covered high lighted and described in detail. The same layer used in both embodiments are also numerically labeled the same in both embodiments.

Figure 9:
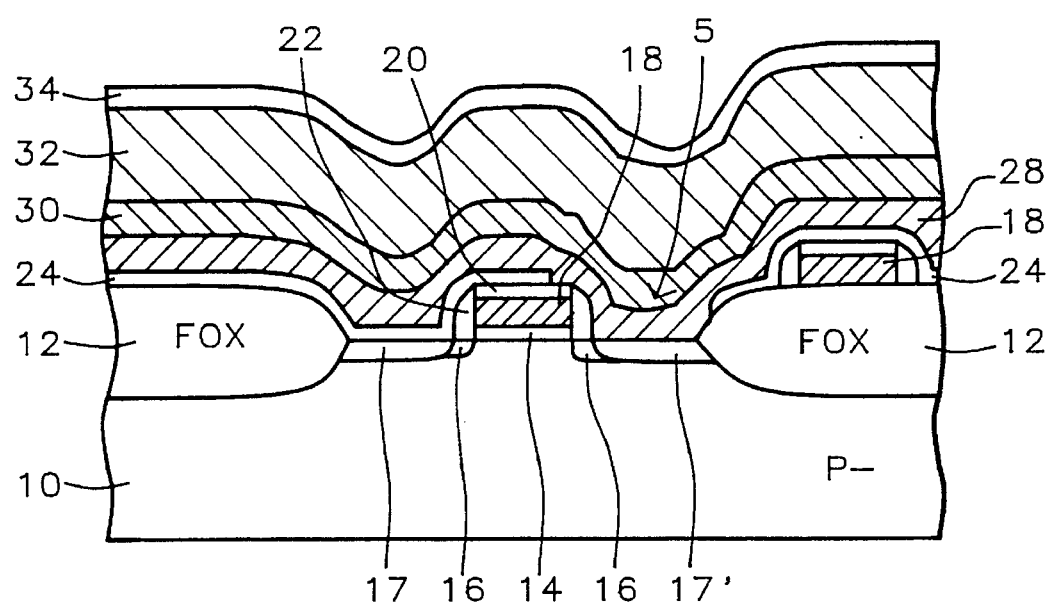
FIGS. 9 through 14 illustrates in schematic cross sectional view for a completed DRAM cell structure for a second embodiment of this invention.

In this second embodiment an additional heavily doped N+ type polysilicon layer is used which is designated as the node polysilicon layer 28 and is deposited prior to depositing the second polysilicon layer 30, as shown in FIG. 9. The node polysilicon is preferably deposited by in situ doped low pressure chemical vapor deposition, and the dopant is a phosphorus having a concentration between about $1.0 \text{ E } 19$ to $1.0 \text{ E } 21$ atoms/$cm^3$. The preferred thickness of layer 28 is between about 3000 to 5000 Angstroms.

Referring now to FIG. 9, the undoped second polysilicon layer 30, the heavily doped third polysilicon layer 32, and the second insulating layer are deposited over the node polysilicon layer 28. However, one important difference from the first embodiment is that the undoped second polysilicon layer 30 is also deposited at a low temperature (<600° C.) to avoid, at this process step, the undesirable out diffusion of the N dopant from the node layer 28 in to layer 30. The thickness of polysilicon layer 30 can also be reduced to compensate for the node polysilicon layer thickness. For example, the preferred thickness of layer 30 is between about 2000 to 4000 Angstroms.

Figure 10:
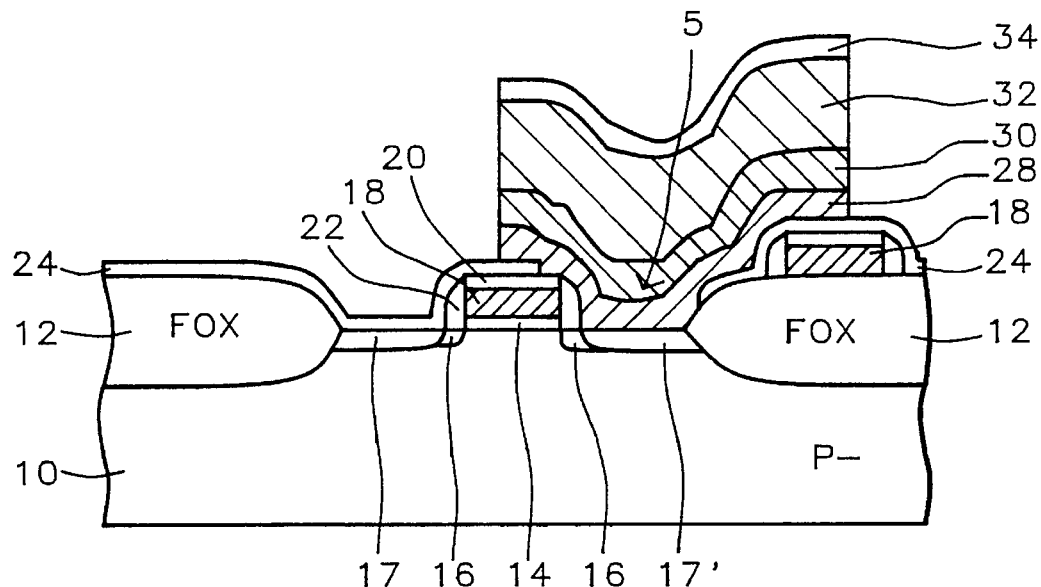
Figure 11:
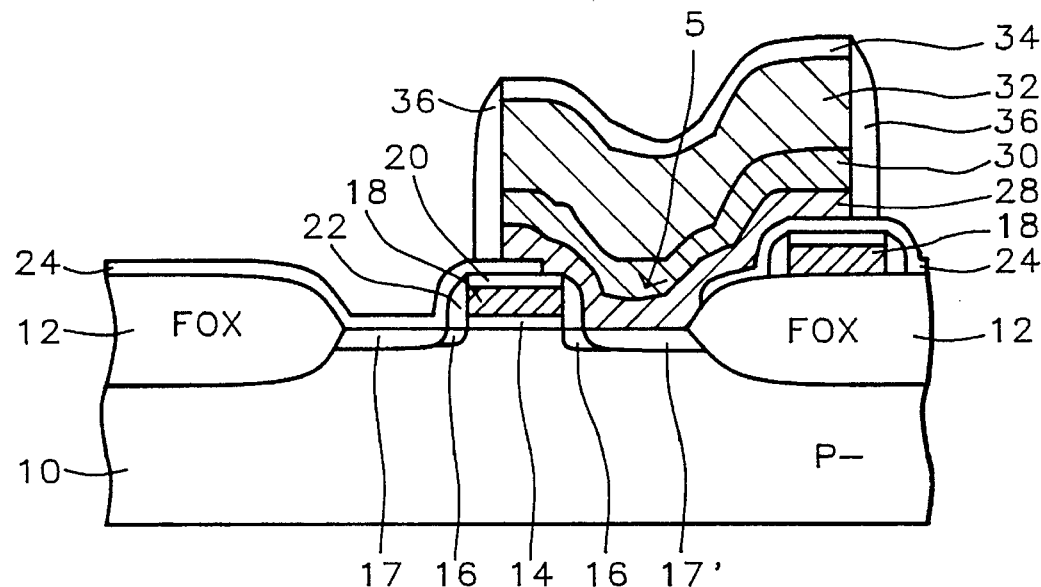

The multilayer composed of polysilicon layers 28, 30 32 and the second insulating layer 34 ($Si_3N_4$) are now patterned as in the first embodiment to define the capacitor bottom electrode over the DRAM cell areas, as shown in FIG. 10. The undoped polysilicon sidewall spacers 36 are formed on the sidewalls as shown in FIG. 11, also according to the method of the first embodiment.

Figure 12:
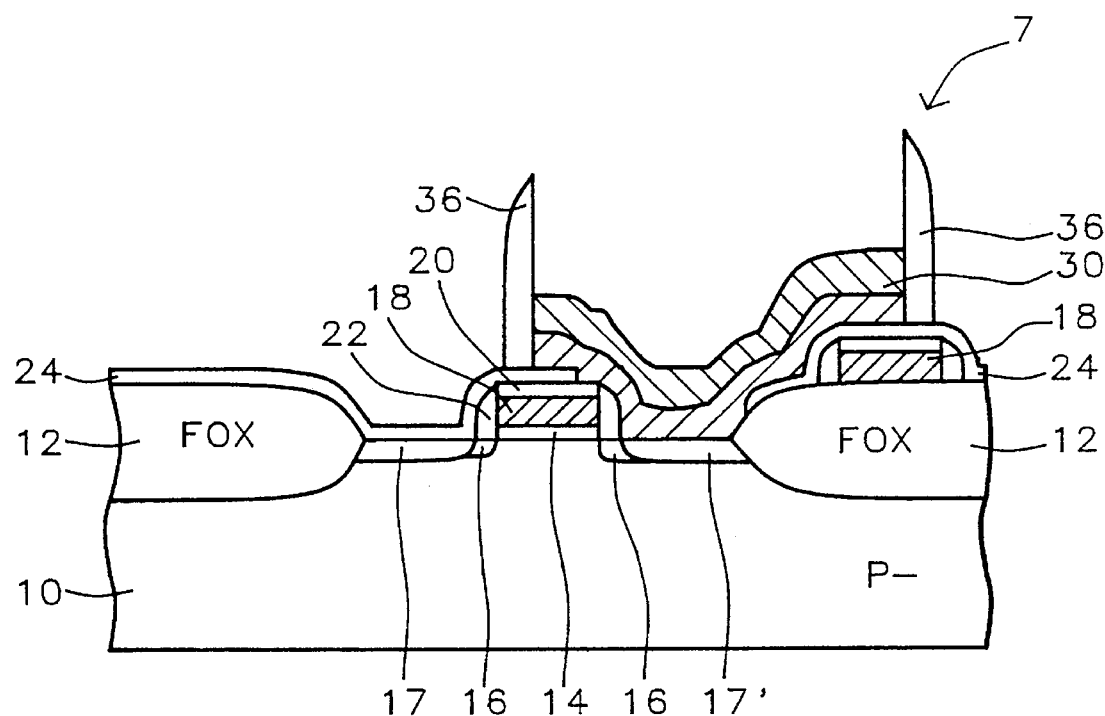

Referring to FIG. 12, the second insulating 34 and heavily doped polysilicon layer 32 are selectively removed in a hot phosphoric acid etch solution leaving essentially unetched the undoped polysilicon layers 30 and 36 that form part of the capacitor bottom electrode 7. The heavily doped node polysilicon layer 28 used in this second embodiment is protected from being etched by layer 30.

Figure 13:
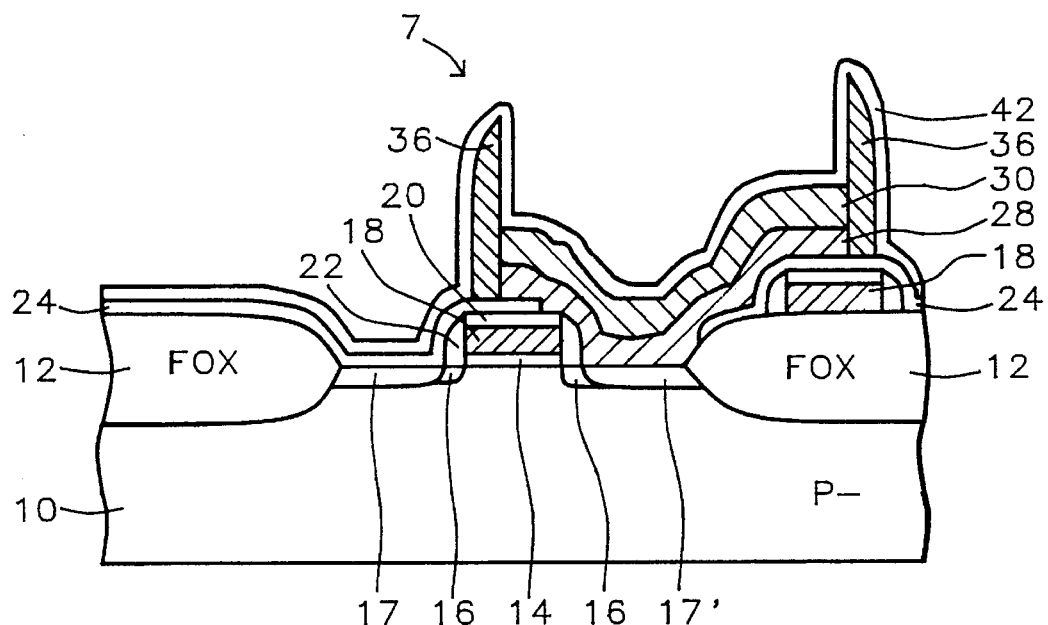

Now, important to the second embodiment, the undoped polysilicon layer 30 and the vertically formed polysilicon sidewalls 36 (spacers) are doped $N^+$ by out diffusion from the heavily doped node polysilicon layer 28, as shown in FIG. 13. This eliminates the need for the ion implantation step that is used in the first embodiment. The doping of layer 30 by out diffusion is achieved by thermal annealing the substrate at a preferred temperature of between about 800° to 900° C., and for an anneal time of about 60 minutes. The out diffusion forms a continuous electrical conducting structure having sidewall portions that substantially increased surface area of the bottom electrode.

Figure 14:
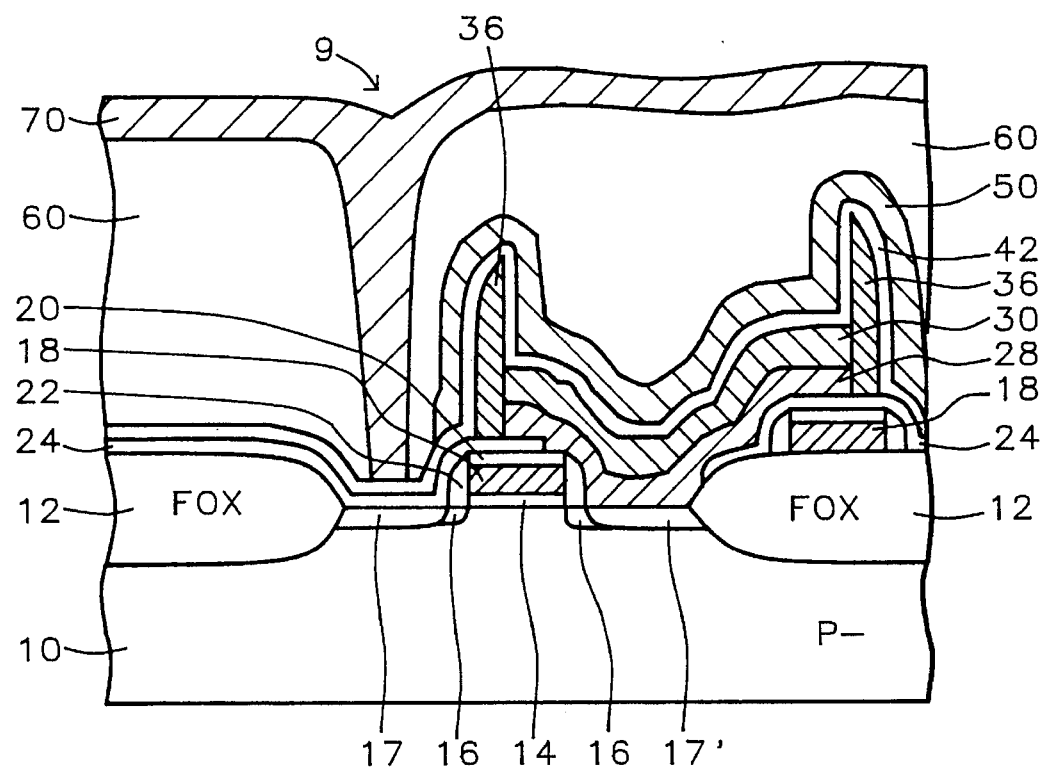

An inter-electrode dielectric layer 42 is formed on the bottom electrode 7 composed of a thin dielectric, such as ONO according to the method of the first embodiment, and as shown in FIG. 14. The array of DRAM cells are then completed, according to the method of the first embodiment, by depositing an $N^+$ doped fifth polysilicon layer 50 that is patterned by conventional means to form the capacitor top electrodes, and depositing a third insulating layer, such as BPSG and forming the bit line contact openings and then depositing the first metal layer such as a polycide or metal and patterning to complete the DRAM cell up to the first metal level of interconnections.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing an array of dynamic random access memory cells on a semiconductor substrate having storage capacitors, comprising the steps of:

forming on a semiconductor substrate an array of device areas having a field oxide area surrounding and electrically isolating each of said device areas;

forming a gate oxide on said device areas;

depositing a first polysilicon layer on said substrate; and depositing a cap oxide on said first polysilicon layer;

patterning said cap oxide and said first polysilicon layer and forming gate electrodes for each field effect transistor on each said device area and forming concurrently from the same said first polysilicon layer word lines elsewhere on said substrate;

forming source/drain areas in said substrate adjacent to said gate electrodes in said device areas;

forming sidewall spacers on said gate electrodes by depositing a sidewall insulating layer and etching back said sidewall insulating layer to said source/drain areas;

forming source/drain contacts in source/drain areas adjacent to said sidewall spacers by ion implantation;

depositing a first insulating layer on said substrate; and forming said storage capacitors by, forming contact openings to one of two source/drain areas on each of said field effect transistor, depositing an undoped second polysilicon layer on said first insulating layer and in said contact openings, depositing a doped third polysilicon layer on said undoped second polysilicon layer, depositing a second insulating layer on said doped third polysilicon layer, patterning anisotropically said second insulating layer, doped third polysilicon and undoped second polysilicon layer leaving portion aligned over said contact openings and over capacitor areas of said memory cells, depositing a conformal undoped fourth polysilicon layer on said patterned second insulating layer and elsewhere on said substrate, anisotropically etching back said undoped fourth polysilicon layer to said second insulating layer, and thereby forming polysilicon sidewall spacers on the sidewalls of said patterned second and third polysilicon layers, removing by selective etching said patterned second insulating layer and said doped third polysilicon layer and thereby forming bottom electrodes for said storage capacitors composed of said undoped second polysilicon layer and said sidewall spacers formed from said fourth polysilicon layer, said sidewall spacers formed from remaining portions of said fourth polysilicon layer increasing the surface area of said bottom electrodes, doping said bottom electrodes, forming an interelectrode dielectric layer on all surfaces of said bottom electrodes, depositing a doped fifth polysilicon layer on said dielectric layer and elsewhere on said first insulating layer;

patterning said fifth polysilicon layer and forming top electrodes of said storage capacitors and thereby completing said array of DRAM memory cells.

2. The method of claim 1, wherein the thickness of said first polysilicon layer is between about 2000 to 4000 Angstroms.

3. The method of claim 1, wherein the thickness of said second polysilicon is between about 4000 to 5000 Angstroms.

4. The method of claim 1, wherein the thickness of said third polysilicon is between about 2000 to 5000 Angstroms.

5. The method of claim 1, wherein said third polysilicon layer is deposited by in situ doped low pressure chemical vapor deposition (LPCVD) at a deposition temperature less than 620° C.

6. The method of claim 1, wherein said third polysilicon layer is in situ doped with phosphorous (P) atoms having a concentration of between about 1.0 E 19 to 1.0 E 21 atoms/cm$^3$.

7. The method of claim 1, wherein said second insulating layer is composed of silicon nitride.

8. The method of claim 7, wherein the thickness of said silicon nitride is between about 100 to 300 Angstroms.

9. The method of claim 1, wherein said fourth polysilicon layer is deposited to a thickness of between about 500 to 1000 Angstroms.

10. The method of claim 1, wherein said fourth polysilicon layer is deposited undoped by low pressure chemical deposition (LPCVD) at a temperature less than 620° C.

11. The method of claim 1, wherein said selective etching is carried out in a hot phosphoric acid solution in the temperature range of between about 140° to 180° C.

12. The method of claim 1, wherein said bottom electrodes are doped by implantation with phosphorus ($P^{31}$) ions having a concentration in said bottom electrodes of between about 1.0 E19 to 1.0 E 21 atoms/cm$^3$.

13. The method of claim 1, wherein said interelectrode dielectric layer is a composite silicon oxide/silicon nitride/silicon oxide (ONO) having a thickness in the range from about 50 to 100 Angstroms.

14. The method of claim 1, wherein said fifth polysilicon layer is doped N-type having a concentration of between about 1.0 E19 to 1.0 E21 atoms/cm$^3$ and said fifth polysilicon layer having a thickness of between about 500 to 1000 Angstroms.

15. A method for manufacturing a dynamic random access memory device on a semiconductor substrate having peripheral read and write circuits and an array of DRAM memory cells, said array of memory cells comprising the steps of:

forming on a semiconductor substrate an array of device areas having a field oxide area surrounding and electrically isolating each of said device areas;

forming a gate oxide on said device areas;

depositing a first polysilicon layer on said substrate; and depositing a cap oxide on said first polysilicon layer;

patterning said cap oxide and said first polysilicon layer and forming gate electrodes for each field effect transistor on each said device area and forming word lines elsewhere on said substrate;

forming source/drain areas in said substrate adjacent to said gate electrodes in said device areas;

forming sidewall spacers on said gate electrodes by depositing a sidewall insulating layer and etching back said sidewall insulating to said source/drain areas;

forming source/drain contacts in source/drain areas adjacent to said sidewall spacers by ion implantation;

depositing a first insulating layer on said substrate; and forming said storage capacitors by, forming contact openings to one of two source/drain areas on each of said field effect transistors, depositing an undoped second polysilicon layer on said first insulating layer and in said contact openings, depositing a doped third polysilicon layer on said undoped second polysilicon layer, depositing a second insulating layer on said doped third polysilicon layer, patterning anisotropically said second insulating layer, doped third polysilicon and undoped second polysilicon layer leaving portion aligned over said contact openings and leaving portions over capacitor areas of said memory cells, depositing an undoped fourth polysilicon layer on said patterned second insulating layer and elsewhere on said substrate, anisotropically etching back said undoped fourth polysilicon layer to said second insulating layer, and thereby forming polysilicon sidewall spacers on the sidewalls of said patterned second and third polysilicon layers, removing by selective etching said second insulating layer and said doped third polysilicon layers and thereby forming bottom electrodes for said storage capacitors composed of said undoped second polysilicon layer and said sidewall spacers formed from said fourth polysilicon layer, said sidewall spacers formed from remaining portions of said fourth polysilicon layer increasing said bottom electrode areas, doping said bottom electrodes by ion implantation, forming an interelectrode dielectric layer on all surfaces of said bottom electrodes, depositing a doped fifth polysilicon layer on said dielectric layer and elsewhere on said first insulating layer;

patterning said fifth polysilicon layer and forming top electrodes of said storage capacitors and thereby forming said array of DRAM memory cells, and depositing a third insulating layer on said DRAM memory cell and elsewhere on said substrate, forming bit line contact openings in said third insulating layer and first insulating to the second of the two source/drain contact areas of each of said field effect transistors, depositing a conducting layer in said bit line contact openings and elsewhere on said substrate, patterning said conducting layer and forming bit lines and further forming electrical interconnections and completing said DRAM device.

16. The method of claim 15, wherein said selective etching is carried out in a hot phosphoric acid solution in the temperature range of between about 140° to 180° C.

17. The method of claim 15, wherein said third polysilicon layer is deposited by in situ doped low pressure chemical vapor deposition (LPCVD) at a deposition temperature less than 620° C.

18. The method of claim 15, wherein said bottom electrodes are doped by ion implantation with phosphorus ($P^{31}$) having a concentration in said bottom electrodes after anneal of between about 1.0 E 19 to 1.0 E 21 atoms/cm$^3$.

19. A method for manufacturing an array of dynamic random access memory cells on a semiconductor substrate having storage capacitors, comprising the steps of:

forming on a semiconductor substrate an array of device areas having a field oxide area surrounding and electrically isolating each of said device areas;

forming a gate oxide on said device areas;

depositing a first polysilicon layer on said substrate; and depositing a cap oxide on said first polysilicon layer;

patterning said cap oxide and said first polysilicon layer and forming gate electrodes for each field effect transistor on each said device area and forming concurrently from the same said first polysilicon layer word lines elsewhere on said substrate;

forming source/drain areas in said substrate adjacent to said gate electrodes in said device areas;

forming sidewall spacers on said gate electrodes by depositing a sidewall insulating layer and etching back to said source/drain areas;

forming source/drain contacts in said source/drain areas adjacent to said sidewall spacers;

depositing a first insulating layer on said substrate; and then forming said storage capacitors by, forming contact openings in said first insulating layer to one of two source/drain areas on each said field effect transistor, depositing a doped node polysilicon layer on said first insulating layer and in said contact openings, depositing an undoped second polysilicon layer on said node polysilicon layer, depositing a doped third polysilicon layer on said undoped second polysilicon layer, depositing a second insulating layer on said doped third polysilicon layer, patterning anisotropically said second insulating layer, doped third polysilicon, undoped second polysilicon layer and node polysilicon layer leaving portion aligned over said contact openings and capacitor areas of said memory cells, depositing a conformal undoped fourth polysilicon layer on said patterned second insulating layer and elsewhere on said substrate, anisotropically etching back said undoped fourth polysilicon layer to said second insulating layer, and thereby forming polysilicon sidewall spacers on the sidewalls of said patterned second, third polysilicon and node polysilicon layers, removing by selective etching said second insulating layer and said doped third polysilicon layers and thereby forming bottom electrodes for said storage capacitors composed of said fourth, second and node polysilicon layers, said sidewall spacers formed from remaining portions of said fourth polysilicon layer increasing the surface area of said bottom electrodes, doping said second and fourth polysilicon layers by out diffusion of dopant from said contact node polysilicon layer and thereby forming said bottom electrodes, forming an interelectrode dielectric layer on all surfaces of said bottom electrodes, depositing a doped fifth polysilicon layer on said dielectric layer and elsewhere on said first insulating layer;

patterning said fifth polysilicon layer and forming top electrodes of said storage capacitors and thereby completing said array of DRAM memory cells.

20. The method of claim 19, wherein the thickness of said contact node polysilicon layer is between about 2000 to 5000 Angstroms.

21. The method of claim 19, wherein said doped node polysilicon layer is doped with phosphorus having a concentration of between about $1.0 \, E \, 19$ to $1.0 \, E \, 21$ atoms/cm$^3$.

22. The method of claim 19, wherein the thickness of said undoped second polysilicon is between about 2000 to 5000 Angstroms.

23. The method of claim 19, wherein said out diffusion of dopant from said doped node polysilicon layer is by annealing said substrate at a temperature of between about 800° to 900° C. for a time of between about 60 to 90 minutes.

* * * * *